United States Patent
Kim et al.

(10) Patent No.: US 7,518,375 B2
(45) Date of Patent: Apr. 14, 2009

(54) METHOD OF ESTIMATING MAXIMUM OUTPUT OF BATTERY FOR HYBRID ELECTRIC VEHICLE

(75) Inventors: Do Youn Kim, Daejeon (KR); Do Yang Jung, Hwaseong-si (KR)

(73) Assignee: LG Chem, Ltd. (KR)

( * ) Notice: Subject to any disclaimer, the term of this patent is extended or adjusted under 35 U.S.C. 154(b) by 163 days.

(21) Appl. No.: 11/368,896

(22) Filed: Mar. 6, 2006

(65) Prior Publication Data

US 2006/0206276 A1    Sep. 14, 2006

(30) Foreign Application Priority Data

Mar. 4, 2005    (KR) .................. 10-2005-0018037

(51) Int. Cl.
    *G01N 27/416* (2006.01)
(52) U.S. Cl. .................. 324/430; 324/427; 324/431
(58) Field of Classification Search .......... 324/427, 324/431
    See application file for complete search history.

(56) References Cited

U.S. PATENT DOCUMENTS

| | | | | |
|---|---|---|---|---|
| 4,061,956 | A * | 12/1977 | Brown et al. ............. | 320/153 |
| 4,968,942 | A * | 11/1990 | Palanisamy ............... | 324/430 |
| 5,325,041 | A * | 6/1994 | Briggs ..................... | 320/149 |
| 5,650,712 | A * | 7/1997 | Kawai et al. ............. | 324/427 |
| 6,417,668 | B1 * | 7/2002 | Howard et al. ............ | 324/426 |
| 6,509,718 | B2 * | 1/2003 | Sakai et al. .............. | 320/134 |
| 6,788,069 | B2 * | 9/2004 | Vacher .................... | 324/430 |
| 7,208,914 | B2 * | 4/2007 | Klang ..................... | 320/132 |
| 2005/0181246 | A1 * | 8/2005 | Nakaji .................... | 429/13 |

* cited by examiner

*Primary Examiner*—Akm E Ullah
*Assistant Examiner*—Nguyen Tran
(74) *Attorney, Agent, or Firm*—Cantor Colburn LLP

(57) ABSTRACT

Disclosed is a method of estimating a maximum output of a battery for a hybrid electric vehicle (HEV). The method comprises extracting maximum charge/discharge outputs of the battery depending on a plurality of charged states (SOC) of the battery under which the vehicle is able to be driven and calculating an interrelation between them; extracting maximum charge/discharge outputs of the battery at plural temperatures under which the vehicle is able to be driven, and calculating an interrelation between them; extracting degradations of outputs of the battery as a capacity of the battery is discharged during the traveling, and calculating an interrelation between them; and based on the interrelations obtained, estimating a maximum output of the battery using a function.

5 Claims, 3 Drawing Sheets

METHOD OF ESTIMATING MAXIMUM OUTPUT OF BATTERY FOR HYBRID ELECTRIC VEHICLE

This application claims the benefit of Korean Patent Application No. 10-2005-0018037, filed on Mar. 4, 2005 in Korea Industrial Property Office, which is hereby incorporated by reference in its entirety for all purposes as if fully set forth herein.

BACKGROUND OF THE INVENTION

1. Field of the Invention

The present invention relates to a method of estimating a maximum output of a battery for a hybrid electric vehicle (HEV), and more particularly to a method of estimating an accurate maximum output of a battery for a hybrid electric vehicle depending on various environmental parameters affecting the maximum output of a battery mounted to a vehicle, thereby increasing an efficiency of the battery and preventing an over-charge or over-discharge of the battery.

2. Description of the Prior Art

In general, an electric vehicle uses a lithium-ion cell, which is a secondary cell, as driving source, drives a power generating device using the power outputted from the cell and transferring it to a driving wheel via a power transmission device to rotate the wheel, thereby driving the vehicle.

In the cell, as a discharge proceeds, a terminal voltage between a cathode and an anode is gradually decreased and reaches a predetermined limit. At this point, the voltage is suddenly dropped to reach a discharge end voltage. After that, the discharge capability is vanished. If the discharge is continued below the discharge end voltage, there occurs a chemical reaction with an electrolyte, so that an electrode plate generating current is damaged and thus a function of a storage battery is lost.

Accordingly, the electric vehicle is structured such that it travels as much as a capacity charged in the battery and re-uses the rotating power of the driving wheels during the traveling to recharge the battery. If the electric vehicle is driven even until the battery is completely discharge and thus stopped during the traveling, it is difficult to recharge the battery. Accordingly, it is important to accurately perceive a residual capacity (SOC; State of Charge) of the battery during the traveling. However, it is difficult to accurately measure the charged amount because of an irregular property of the battery (i.e., it is changed due to temperature, discharge, etc.), as compared to a fuel gauge of an existing vehicle.

Commercially, methods of checking the SOC of the battery include measurement of a cell voltage or a discharge capacity in order to check the SOC.

However, in the former method, the voltage is decreased depending on the discharge amount. In other words, the voltage is suddenly decreased in rapidly accelerating, irrespective of the SOC. In addition, in the latter method, since the available capacity of the cell is different depending on load conditions (for example, the constant speed traveling or traveling in city is made at how kilometers per hour), an algorithm for checking the SOC is very complex.

In the mean time, parameters affecting the maximum output of the battery include a charged state of the battery, a temperature environment and an output degradation depending on the discharge capacity during the traveling. In generally, the battery adopted in the hybrid vehicle undergoes the rapid charge/discharge due to the rapid acceleration and deceleration which frequently occur during the traveling. Due to the rapid charge/discharge, the charged state and the maximum output of the battery exhibit a dynamic behavior having a high rate of change. In addition, the maximum output of the battery is highly changed depending on the temperatures. Accordingly, it is very difficult to accurately predict the maximum output of the battery during the traveling due to the various parameters.

SUMMARY OF THE INVENTION

Accordingly, the present invention has been made to solve the above problems.

An object of the present invention is to provide a method of estimating an accurate maximum output of a battery adopted in a vehicle and transmitting the estimated information to a control unit of the vehicle at real time to match an output of a motor with a state of the battery, thereby increasing an efficiency of the battery and preventing an over-charge or over-discharge of the battery to maximize the lifetime of the battery.

The above object is achieved by examining maximum outputs under various environments (charged state of a battery, temperature) in which the vehicle is driven, developing relational equations showing an interrelation between the maximum output and the charged state of the battery and between the maximum output and the temperature of the battery, and thus estimating a maximum output of a battery for a hybrid vehicle.

More specifically, according to the present invention, there is provided a method of estimating a maximum output of a battery for a hybrid electric vehicle comprising steps of: extracting maximum charge/discharge outputs of the battery depending on a plurality of charged states (SOC) of the battery under which the vehicle is able to be driven, to calculate an interrelation between them; extracting maximum charge/discharge outputs of the battery at plural temperatures under which the vehicle is able to be driven, to calculate an interrelation between them; extracting degradations of outputs of the battery as a capacity of the battery is discharged during the traveling, to calculate an interrelation between them; and based on the interrelations obtained from each of the steps, estimating a maximum output (Power$_{max}$) of the battery through a following function.

$$Power_{max} = F(SOC, \text{temp, accumulated discharge Ah})$$

$$= F(SOC, \text{temp}) \times F(\text{accumulated discharge Ah})$$

According to the present invention, the above function, F(SOC, temp) is calculated by a following relational equation.

$$F(SOC, \text{temp}) = F(\text{temp})_5 \times SOC^5 + F(\text{temp})_4 \times SOC^4 + F(\text{temp})_3 \times SOC^3 + F(\text{temp})_2 \times SOC^2 + F(\text{temp})_1 \times SOC + F(\text{temp})_0$$

where $F(\text{temp}) = D_2 \times \text{temp}^2 + D_1 \times \text{temp}^1 + D_0 (D_0 \sim D_2:$ constant)

According to the present invention, the maximum output of the battery may be compensated by a following relational equation showing a degradation of battery depending on the accumulated capacity of battery which is discharged during the traveling.

$$F(\text{accumulated discharge } Ah) = C_5 k^5 + C_4 k^4 + C_3 k^3 + C_2 k^2 + C_1 k + C_0$$

where $C_5 \sim C_0$: constant k is within an range of [0, 300000] and is inputted with a modified value within a range of [−1, 1] when it is inputted as an input value into the function.

Therefore, according to the present invention, the maximum output of the battery is estimated by a following relational equation.

$$Power_{max} = \{F(temp)_5 \times SOC^5 + F(temp)_4 \times SOC^4 + F(temp)_3 \times SOC^3 + F(temp)_2 \times SOC^2 + F(temp)_1 \times SOC + F(temp)_0\} \times (C_5 k^5 + C_4 k^4 + C_3 k^3 + C_2 k^2 + C_1 k + C_0)$$

According to an embodiment of the present invention, the method may further comprise a step of transmitting the estimated maximum output to a vehicle control device of the hybrid electric vehicle via a battery management system (BMS) to control the charge/discharge outputs of the battery.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description of the present invention, a detailed description of known functions and configurations incorporated herein will be omitted when it may make the subject matter of the present invention rather unclear.

A maximum output of a battery is determined by various parameters, i.e., a charged state (SOC) of the battery, a temperature and a degradation of output depending on discharged capacity during the traveling. According to the prior art, when estimating the maximum output of the battery, it has been developed and used a method of estimating an output of the battery depending on one parameter only (for example, SOC), without considering the effects of the above parameters on the output of the battery. Accordingly, the developed method cannot accurately estimate the output of the battery, which results from no consideration of the effects of the above parameters on the output of the battery.

However, the inventors found the fact that all the SOC of the battery, the temperature and the capacity discharged during the traveling affect the output of the battery, and in order to estimate a maximum output of the battery more accurately, the inventors developed a novel method of estimating a maximum output of a battery with considerations of all the above parameters.

Figure 1:
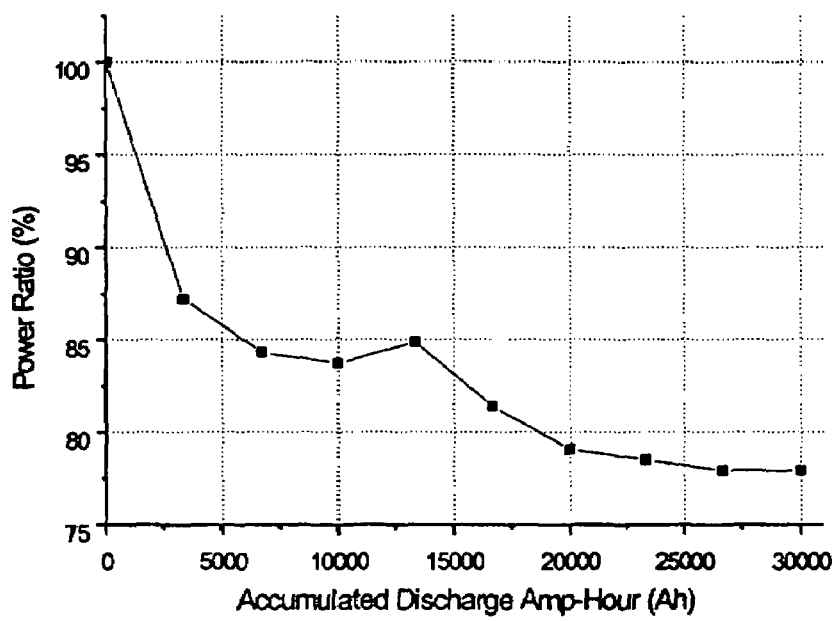
FIG. 1 is a view showing a relationship between accumulated discharge capacity and degradation of output of a battery, in accordance with an embodiment of the present invention.
Figure 2:
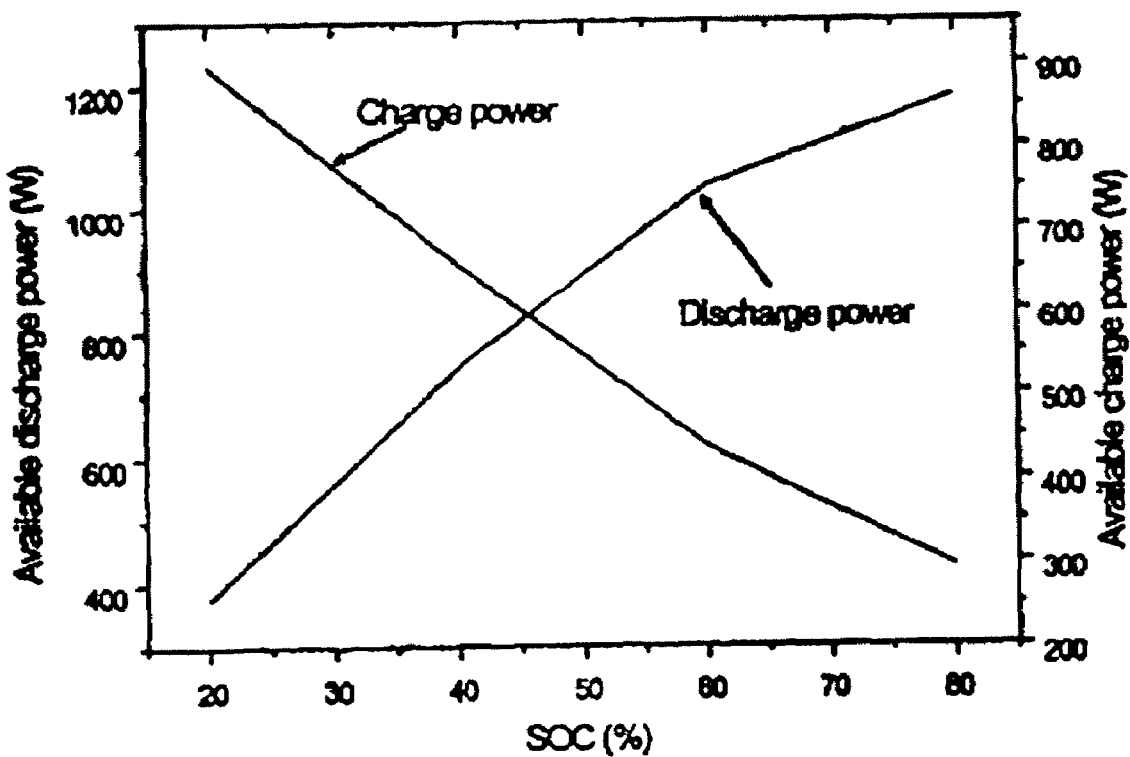
FIG. 2 is a view showing a relationship between a residual capacity (SOC) of a battery and maximum charge/discharge outputs of a battery, in accordance with the embodiment of the present invention.
Figure 3:
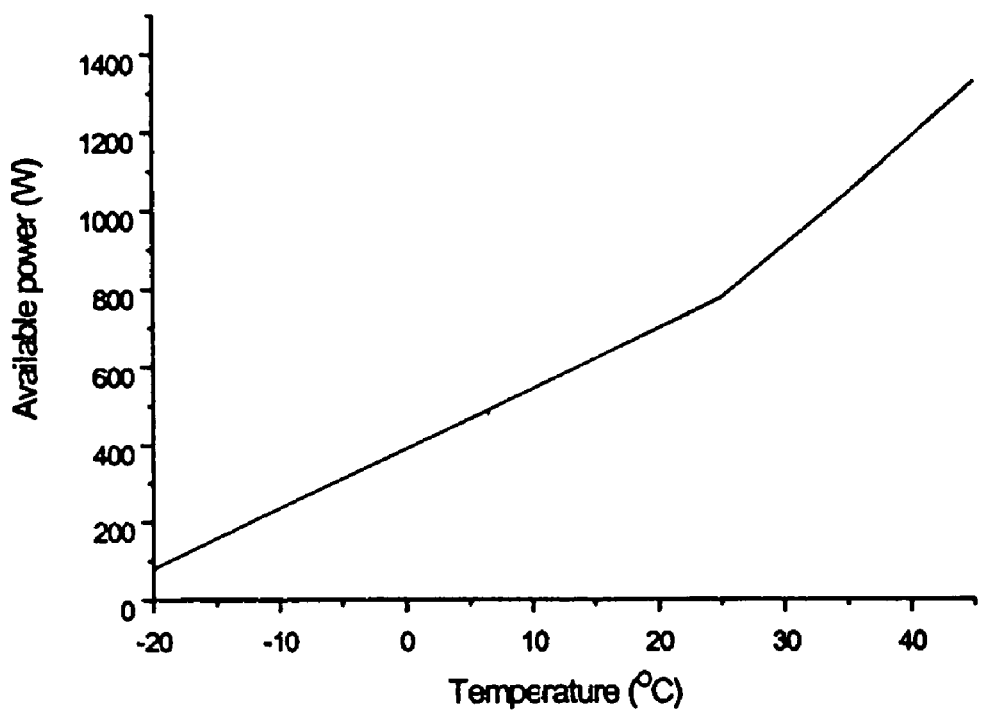
FIG. 3 is a view showing a relationship between a temperature and a maximum output of a battery, in accordance with the embodiment of the present invention.

First, as shown in FIGS. 1 to 3, in order to estimate a maximum output of a battery, maximum outputs are examined under various environments (degradation of output depending on discharged capacity during the traveling, SOC, temperature) in which a vehicle can be driven and then it is calculated interrelations between each of the parameters and the outputs. The calculated interrelations are used to estimate a maximum output of a battery through following procedures.

In other words, a maximum charge/discharge output (Power$_{max}$) of a battery can be expressed by a following function.

$$Power_{max} = F(SOC, temp, accumulated\ discharge\ Ah) \quad \text{[equation 1]}$$
$$= F(SOC, temp) \times F(accumulated\ discharge\ Ah)$$

In the equation 1, F(SOC, temp) can be expressed as a curve function by a following equation.

$$F(SOC, temp) = F(temp)_5 \times SOC^5 + F(temp)_4 \times SOC^4 + F(temp)_3 \times SOC^3 + F(temp)_2 \times SOC^2 + F(temp)_1 \times SOC + F(temp)_0 \quad \text{[equation 2]}$$

In the equation 2, F(temp) can be expressed as a temperature function by a following equation.

$$F(temp) = D_2 \times temp^2 + D_1 \times temp^1 + D_0 \,(D_0 \sim D_2: constant) \quad \text{[equation 3]}$$

In the mean time, the output of the battery may be degraded as the battery is discharged during the traveling. According to the present invention, compensating the degradation of the output of the battery which is decreased as the battery is discharged during the traveling result in further increasing an accuracy of the estimation of the maximum output.

Figure 4:
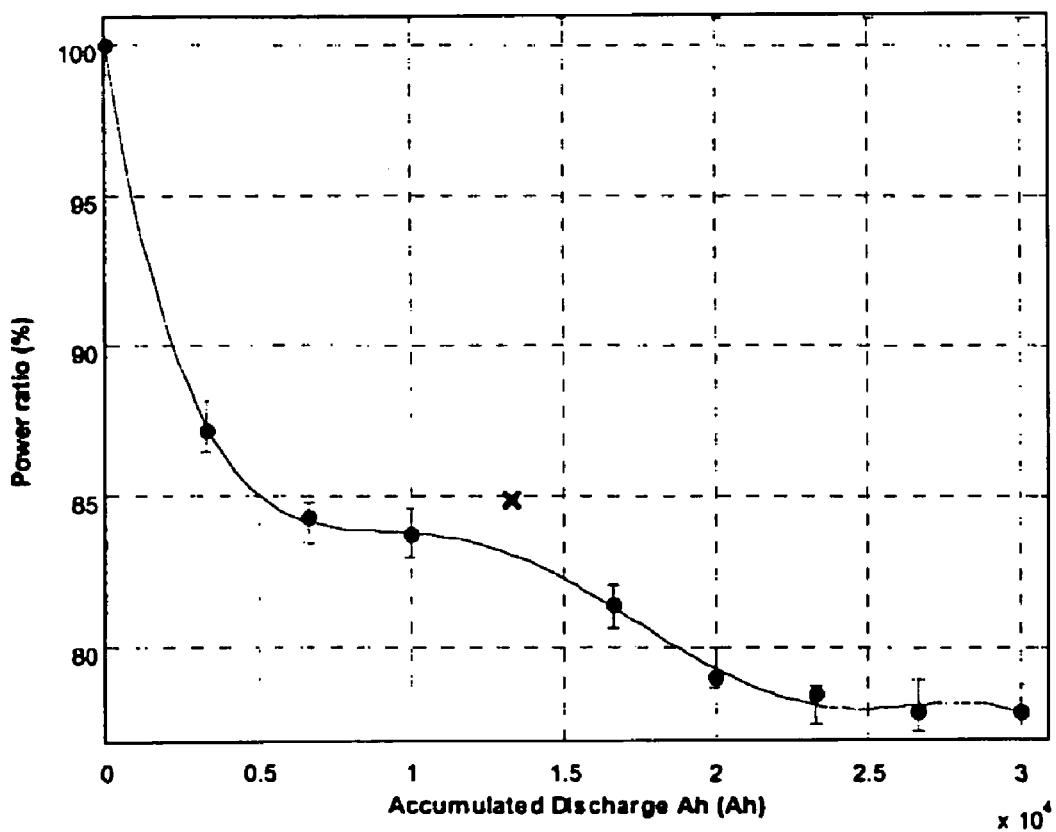
FIG. 4 is a graph showing an experimental example of a capacity of a battery discharged during the traveling and degradation of output, in accordance with the embodiment of the present invention.

Specifically, the degradation of the output is estimated by accumulating the capacity of the battery which is discharged during the traveling. As shown in FIG. 4, the experimental data of the accumulated discharge capacity and the output degradation of the battery is fitted. Using the data, a following equation 4 can be induced.

$$F(accumulated\ discharge\ Ah) = C_5 k^5 + C_4 k^4 + C_3 k^3 + C_2 k^2 + C_1 k + C_0 \quad \text{[equation 4]}$$

Where each of $C_5 \sim C_0$ is constant

According to an embodiment of the present invention, the equation 4 is specifically expressed as follows.

$$F(accumulated\ discharge\ Ah) = -16.3986 k^5 + 15.0026 k^4 + 13.307 k^3 - 8.38698 k^2 - 7.96289 k + 82.3028$$

In the above equation, k is accumulated discharge capacity within an range of [0, 300000] and is inputted with a modified value within a range of [−1, 1] when it is inputted as an input value into the function (i.e., k'=[−1, 1]). For example, when k=0, k' is −1, when k=150,000, k' is 0, and when k=300,000, k' is 1. In other words, it is possible to input the value of k while proportionally reducing a scale thereof.

When the equations 2 and 4 are inserted into the equation 1, the maximum charge/discharge output of the battery is estimated by a following relational equation.

$$Power_{max} = \{F(temp)_5 \times SOC^5 + F(temp)_4 \times SOC^4 + F(temp)_3 \times SOC^3 + F(temp)_2 \times SOC^2 + F(temp)_1 \times SOC + F(temp)_0\} \times (C_5 k^5 + C_4 k^4 + C_3 k^3 + C_2 k^2 + C_1 k + C_0) \quad \text{[equation 5]}$$

In other words, by extracting the outputs of the battery depending on each of the parameters affecting the outputs and using the interrelations between them, it is possible to estimate the charge/discharge output of the battery through the equation 5.

The maximum charge/discharge outputs estimated through the above procedures are transmitted to a vehicle control device of the hybrid electric vehicle via a battery management system (BMS) to control the charge/discharge outputs of the battery.

EXAMPLE

Figure 5:
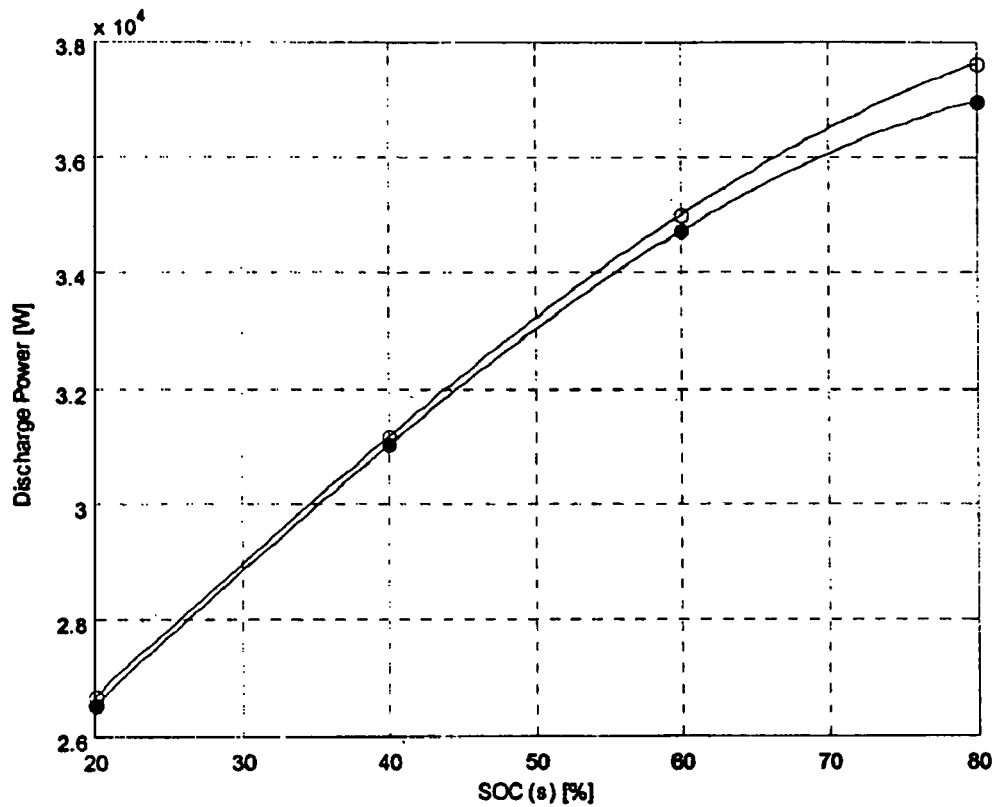
FIGS. 5 and 6 are graphs comparing actual maximum charge/discharge outputs of a battery at 25° C. and a maximum output of a battery estimated in accordance with the embodiment of the present invention.
Figure 6:
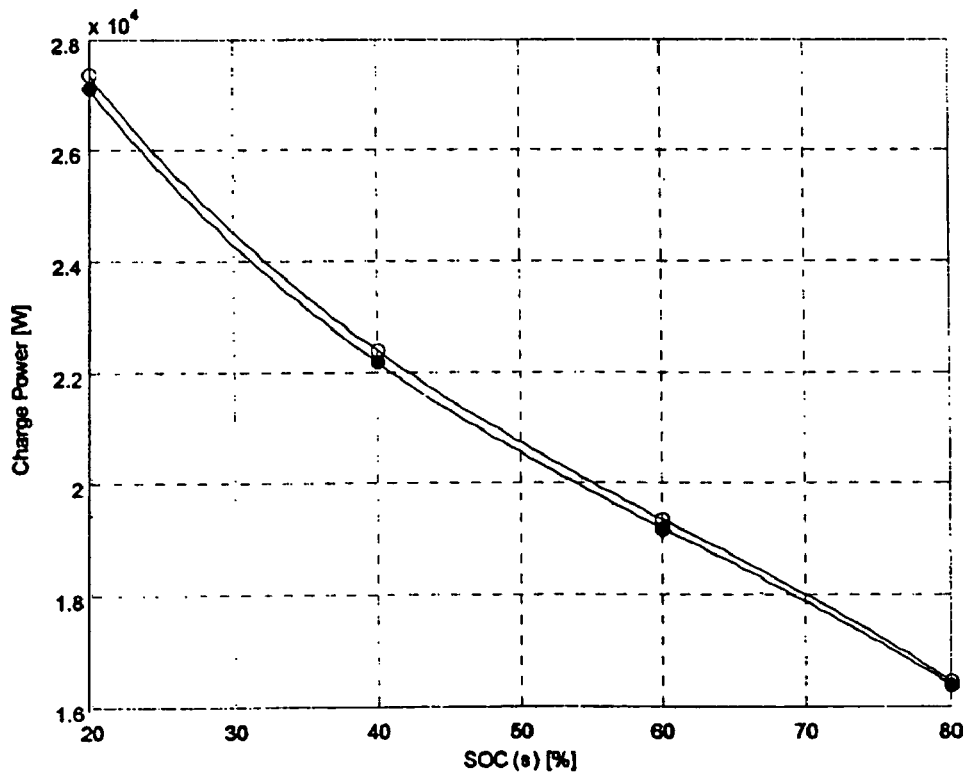

The inventors carried out a test for verifying the accuracy of the method according to the present invention and obtained results as shown in FIGS. 5 and 6.

FIGS. 5 and 6 are graphs comparing actual maximum charge/discharge outputs of a battery at 25° C. and a maximum output of a battery estimated through the above equations. From the graphs, it can be seen that there occurs an error of about 2.2% only. This is an allowable error when actually controlling the charge/discharge outputs of the battery. That is, it is possible to estimate a maximum output of the battery which is nearly equal to the actual output.

As described above, according to the present invention, the output of the battery is accurately estimated in advance by considering the SOC, the temperature and the degradation of the output as the capacity of the battery is discharged during the traveling, which affect the output of the battery mounted to the hybrid electric vehicle. As a consequence, it is possible to increase an efficiency of the battery and to prevent the over charge and over discharge of the battery.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method of estimating a maximum output of a battery for a hybrid electric vehicle comprising steps of:
   extracting maximum charge or discharge outputs of the battery depending on a plurality of charged states (SOC) of the battery under which the vehicle is able to be driven and calculating an interrelation between them;
   extracting maximum charge or discharge outputs of the battery at plural temperatures (temp) under which the vehicle is able to be driven, and calculating an interrelation between them;
   extracting degradations of outputs of the battery as a capacity of the battery is discharged (accumulated discharge Ah) during traveling, and calculating an interrelation between them; and
   based on the interrelations obtained from each of the steps, estimating a maximum output ($Power_{max}$) of the battery through a following function:

$$Power_{max} = F(SOC, temp, \text{accumulated discharge } Ah)$$
$$= F(SOC, temp) \times F(\text{accumulated discharge } Ah),$$

wherein
F(accumulated discharge Ah)=$C_5k^5+C_4k^4+C_3k^3+C_2k^2+C_1k+C_0$, where each of $C_5$~$C_0$ is constant, and
k is a discharged capacity of the battery, is within a range of [0, 300000] and is inputted with a modified value within a range of [−1, 1] when it is inputted as an input value into the function.

2. The method according to claim 1, wherein the function, F(SOC, temp) is calculated by a following relational equation:

$$F(SOC, temp)=F(temp)_5 \times SOC^5+F(temp)_4 \times SOC^4+F(temp)_3 \times SOC^3+F(temp)_2 \times SOC^2+F(temp)_1 \times SOC+F(temp)_0$$

where F(temp)=$D_2 \times temp^2+D_1 \times temp^1+D_0$ ($D_0$~$D_2$: constant).

3. The method according to claim 1, wherein the degradation of the output depending on the discharged capacity of the battery is expressed by a following equation:

$$F(\text{accumulated discharge } Ah)=-16.3986k^5+15.0026k^4+13.307k^3-8.38698k^2-7.96289k+82.3028.$$

4. The method according to claim 3, further comprising a step of transmitting the estimated maximum output to a vehicle control device of the hybrid electric vehicle via a battery management system (BMS) to control the charge or discharge output of the battery.

5. The method according to claim 1, further comprising a step of transmitting the estimated maximum output to a vehicle control device of the hybrid electric vehicle via a battery management system (BMS) to control the charge or discharge output of the battery.

* * * * *